United States Patent [19]
Lin et al.

[11] Patent Number: 5,239,198
[45] Date of Patent: Aug. 24, 1993

[54] OVERMOLDED SEMICONDUCTOR DEVICE HAVING SOLDER BALL AND EDGE LEAD CONNECTIVE STRUCTURE

[75] Inventors: Paul T. Lin; Michael B. McShane, both of Austin, Tex.

[73] Assignee: Motorola, Inc., Schaumburg, Ill.

[21] Appl. No.: 907,970

[22] Filed: Jul. 2, 1992

Related U.S. Application Data

[63] Continuation-in-part of Ser. No. 876,315, Apr. 30, 1992, which is a continuation of Ser. No. 756,952, Sep. 9, 1991, Pat. No. 5,200,362, which is a continuation of Ser. No. 576,255, Aug. 31, 1990, abandoned.

[30] Foreign Application Priority Data

Sep. 6, 1989 [JP] Japan .................. 1-231323

[51] Int. Cl.[5] ............ H01L 23/12; H01L 23/14; H01L 23/48
[52] U.S. Cl. .................. 257/693; 257/779; 257/787; 257/691
[58] Field of Search ......... 257/723, 724, 778, 777, 257/779, 734, 774, 773, 691, 737, 738, 698, 693, 787, 692; 361/387

[56] References Cited

U.S. PATENT DOCUMENTS

| | | | |
|---|---|---|---|
| 4,264,917 | 4/1981 | Ugon | 257/787 |
| 4,647,126 | 3/1987 | Sabota, Jr. | 361/405 |
| 4,807,021 | 2/1989 | Okumura | 257/777 |
| 4,922,378 | 5/1990 | Malhi et al. | 257/725 |
| 4,967,262 | 10/1990 | Farnsworth | 357/80 |
| 4,975,763 | 12/1990 | Baudouin et al. | 357/74 |
| 5,018,005 | 5/1991 | Lin et al. | 257/692 |
| 5,095,359 | 3/1992 | Tanaka et al. | 257/691 |

OTHER PUBLICATIONS

"Clipped Decoupled Twin-Carrier Module for IC Memory Chips"-IBM Technical Disclosure Bulletin-Hinrichsmeyer et al vol. 27, No. 8, Jan. 1985.

*Primary Examiner*—Rolf Hille
*Assistant Examiner*—S. V. Clark
*Attorney, Agent, or Firm*—James L. Clingan, Jr.

[57] ABSTRACT

A low cost manufacturing method is used to fabricate a small multiple chip semiconductor device (10). In one embodiment, a first pattern of conductive traces (14) is formed on one surface of a substrate (12), and a second pattern of traces (16) is formed on a second surface of the substrate (12). A first semiconductor die (20) is interconnected to the first traces (14), and a package body (24) is formed around the first die and a portion of the traces. A second semiconductor die (26) is interconnected to the second traces (16) on the second surface. A second package body (28) is formed around the second die and a portion of the traces (16). Solder balls (32) are coupled to exposed portions of the second traces (16) around the perimeter of the package body (28) to establish external power and ground connections to each die. Edge leads (36) are externally soldered to the traces (14 & 16) around the periphery of the substrate (12) to establish remaining electrical connections.

35 Claims, 5 Drawing Sheets

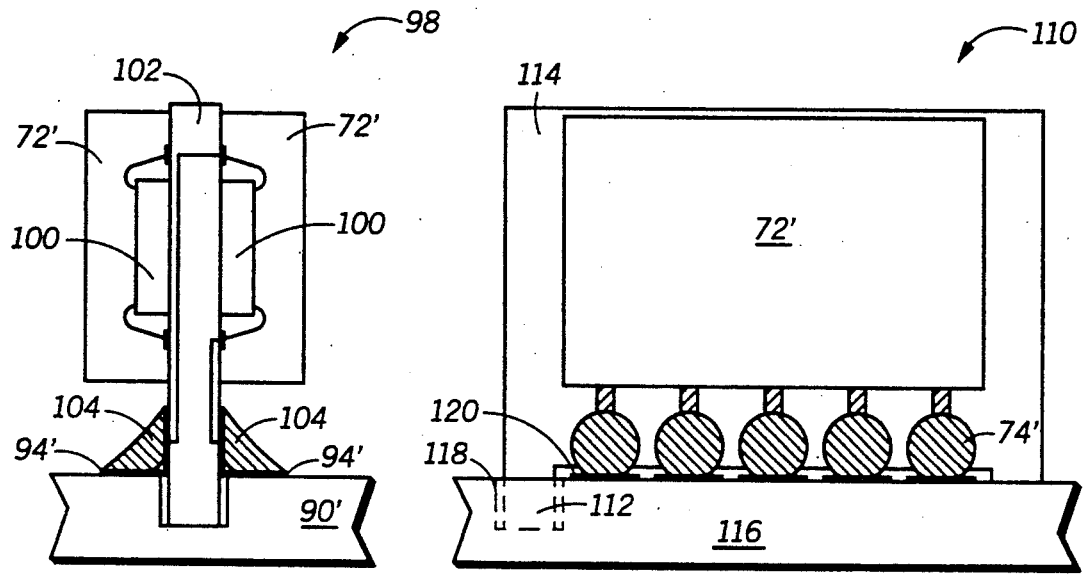
FIG.10  FIG.11
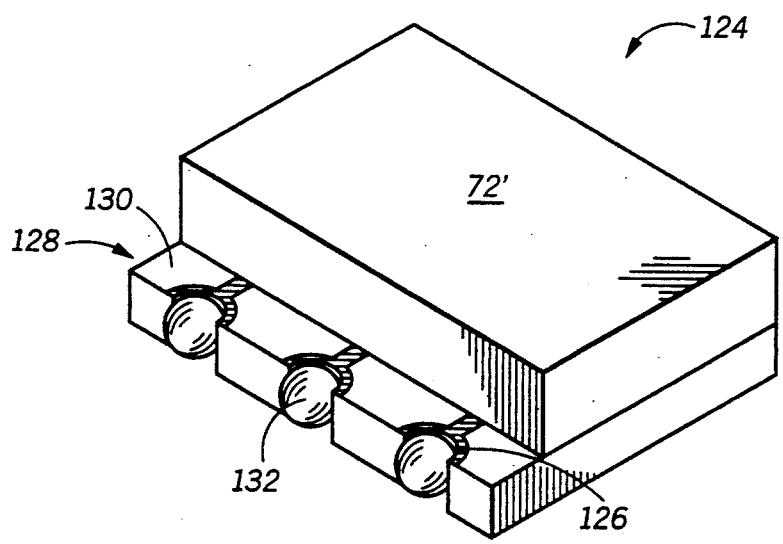
FIG.12

OVERMOLDED SEMICONDUCTOR DEVICE HAVING SOLDER BALL AND EDGE LEAD CONNECTIVE STRUCTURE

CROSS-REFERENCE TO RELATED APPLICATION

This application is a continuation-in-part of a copending patent application entitled, "Resin Encapsulated Multichip Semiconductor Device and Method for Its Fabrication," by Paul T. Lin et al., Ser. No. 07/876,315, filed Apr. 30, 1992, which is a continuation of Ser. No. 07/756,952, filed Sep. 9, 1991, now U.S. Pat. No. 5,200,362 which is a continuation of Ser. No. 07/576,255, filed Aug. 31, 1990, now abandoned, and claims priority to a Japanese patent application Hei 1-231323, filed Sep. 6, 1989.

FIELD OF THE INVENTION

This invention relates to semiconductor devices in general, and more specifically to overmolded semiconductor devices which have multiple electronic components and to methods for fabricating such devices.

BACKGROUND OF THE INVENTION

Semiconductor devices are widely used in various types of electronic products, consumer products, automobiles, integrated circuit cards, and the like. One feature of semiconductor devices which is important in many of these applications is the small size of a semiconductor device, which includes both the semiconductor die and the package in which it is housed. Keeping device dimensions as small as possible is not only important to single chip devices, but to multiple chip devices as well. However, there is a competing desire for additional I/O's which tends to increase the overall size of the semiconductor device or results in a device having a very fine lead pitch which makes it difficult for the end user to handle.

In addition to establishing a small device size, manufacturers are also driven to maintaining a low cost of manufacturing devices. A significant material cost in manufacturing a semiconductor device other than the semiconductor die is the leadframe. For many devices, a customized leadframe must be designed and manufactured for each semiconductor die which is both costly and time consuming.

Multiple chip semiconductor devices are gaining popularity because multiple chip devices significantly increase device packing density on a substrate, for example on a printed circuit (PC) board. However, one aspect which is slowing industry acceptance of multiple chip devices is prohibitive manufacturing costs. Many multiple chip devices utilize expensive ceramic substrates and employ additive thin-film processing on semiconductor die, processes which significantly increase manufacturing costs.

Resin encapsulated semiconductor devices are usually packaged by either one of two methods. In one method, a semiconductor die, or a plurality of die, is placed in a package which is then individually mounted on a circuit substrate. In an alternate method, a semiconductor die, or a plurality of die, is mounted directly on the circuit substrate and then is provided with a protective encapsulation structure. The first mentioned method has the advantages that the die is sealed in and protected by the package. The packaged device is easy to test, handle, and install and the encapsulating package provides the desired degree of protection against the environment. In contrast, the second described method in which the die is connected directly to the substrate minimizes the area required by the die and thus allows a very high substrate packing density. In this method, however, an unpackaged die is less easily handled, tested, and burned-in, and is more subject to undesirable effects of the environment.

In addition to mounting multiple semiconductor dice onto a substrate for increased packing density, board space can be saved by the vertical mounting of a semiconductor device. Vertical devices are attractive because they have a very narrow horizontal cross section, which permits a greater circuit board mounting density. A typical vertically mounted device is a zig-zag in line package (ZIP) wherein the leads exit through the lower edge of the package. A disadvantage to the ZIP is that it is a through-hole type of package, and the leads may become damaged or bent which would render the connection to the board unreliable. Another type of vertical device is a single in-line memory module (SIMM). A SIMM actually consists of a multiplicity of individually packaged devices mounted on a board that has edge connectors for plugging into a socket. A disadvantage of a SIMM board is its size due to the individual packages. A further disadvantage of a SIMM is the cost associated with the assembly process of packaging each semiconductor die separately.

SUMMARY OF THE INVENTION

This invention provides a low cost, overmolded semiconductor device and a method for its fabrication which also achieves a multiple chip module without increasing the size of a fully packaged device. In accordance with one embodiment of the invention, a semiconductor device is fabricated by providing a substrate on which a pattern of conductive traces is provided on a surface of the substrate. At least one electronic component is interconnected to the pattern of conductive traces, and a package body is overmolded around the electronic component and a first portion of the pattern of conductive traces, leaving a second portion of the pattern of conductive traces exposed. A plurality of solder balls is attached to a portion of the second portion of the pattern of conductive traces, and a plurality of edge leads is externally connected to the periphery of the substrate, wherein both the plurality of solder balls and the plurality of edge leads provide external electrical connections to the device.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

FIG. 10 illustrates, in cross section, a vertically mounted multiple chip semiconductor device, in accordance with a fifth embodiment of the invention.

FIG. 11 illustrates, in a front view, a vertically mounted semiconductor device with an optional alignment pin configuration, in accordance with a sixth embodiment of the invention.

FIG. 12 illustrates, in an oblique view, a semiconductor device with edge half-vias filled with solder balls, in accordance with a seventh embodiment of the present invention.

DETAILED DESCRIPTION OF A PREFERRED EMBODIMENT

Figure 1:
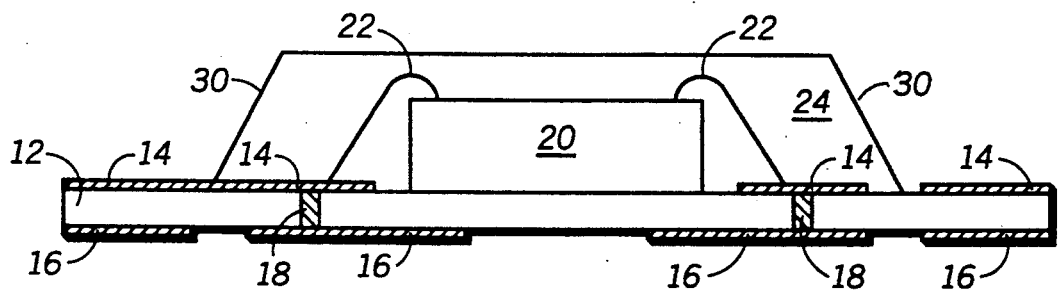
FIG. 1 illustrates, in cross section, process steps in accordance with a first embodiment of the invention for the fabrication of a semiconductor device.
Figure 2:
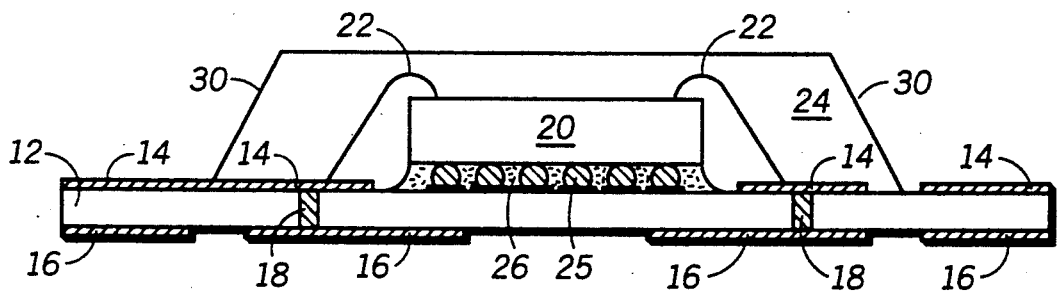
FIG. 2 illustrates, in cross section, a flip chip/direct chip attachment method, an alternative process step to that illustrated in FIG. 1.
Figure 3:
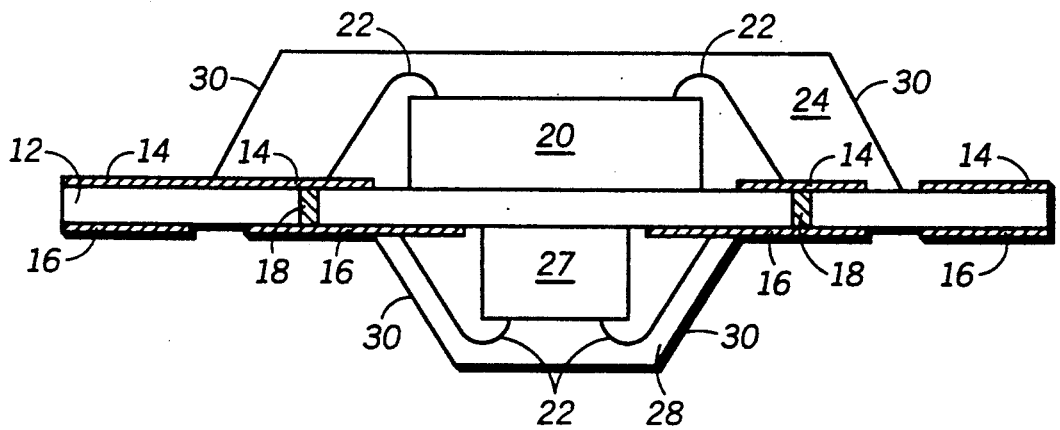
FIGS. 3-4 illustrate, in cross section, remaining process steps in accordance with a first embodiment of the invention for the fabrication of a semiconductor device.
Figure 4:
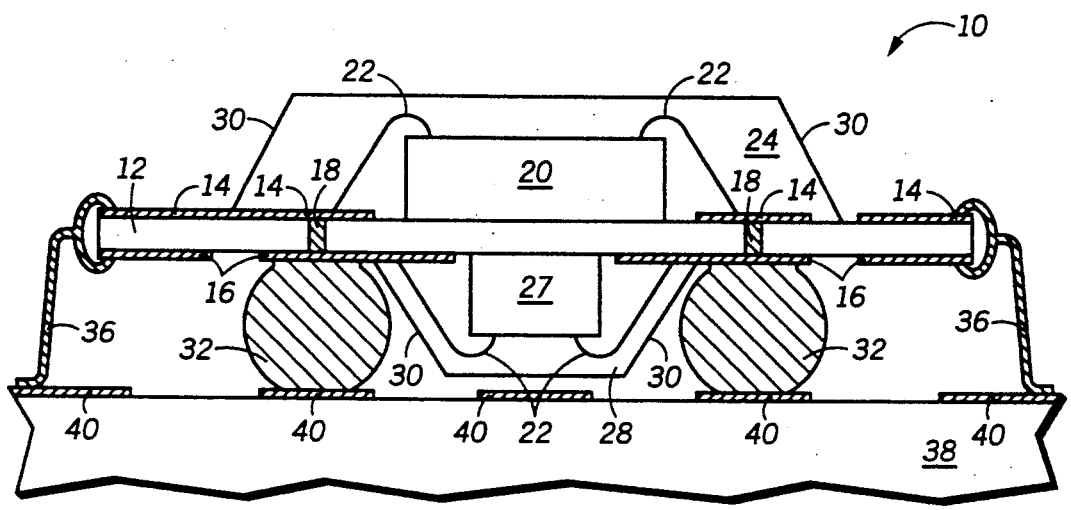

FIGS. 1, 3 & 4 illustrate, in cross section, process steps in accordance with one embodiment of the invention, where FIG. 4 further illustrates a completed multiple chip semiconductor device 10. FIG. 2 illustrates an alternative process step to FIG. 1, but does not affect the remaining process steps illustrated in FIGS. 3–4. As illustrated in FIG. 1, a substrate 12 is provided with a first pattern of conductive traces 14 on a first side of the substrate 12 and a second pattern of conductive traces 16 on a second opposing side of substrate 12. Substrate 12 can be a conventional printed circuit board made of a resin filled glass fabric, such as FR4 or G10 materials having the patterns of conductive traces 14 and 16 on both top and bottom surfaces of the substrate. Methods for forming patterns of conductive traces on a PCB substrate are well known in the art. As illustrated in FIG. 1, a portion of the traces 14 which are on the first (top) surface of substrate 12 are connected to a portion of the traces 16 on the second (bottom) surface of substrate 12 by a plurality of conductive through-holes 18 because traces can be shared between components in a device. Typical examples of shared traces include traces used for power and traces used for ground.

As illustrated in FIG. 1, a semiconductor die 20 is electrically connected to the first pattern of conductive traces 14 by way of wire bonds 22. However, other methods of electrical connections such as tape automated bonding (TAB), flip chip/direct chip attach, or the like may also be used. Die 20 is also mechanically attached to the substrate 12. Mechanical attachment can be achieved by using a die attach epoxy or any other suitable adhesive medium. After die 20 is electrically connected to conductive traces 14, a first molding operation is performed to overmold semiconductor die 20, wire bonds 22, and a first portion of the first pattern of conductive traces 14 with an encapsulating material to form a first package body 24. Package body 24 is formed in a conventional manner, such as by transfer molding, in which the substrate 12 with the attached semiconductor die 20 is inserted into a mold cavity and the encapsulating material is forced into the cavity at a high temperature and high pressure. Alternatively, package body 24 can be made by injection molding, pour molding, or in a "glob top" process. In each of these overmolding type operations, the encapsulating material is formed on one side of substrate 12. The encapsulating material thus covers the semiconductor die, the wire bonds, and at least a first portion of the pattern of conductive traces 14.

Illustrated in FIG. 2 is a flip chip attachment method for semiconductor die 20, as mentioned previously. A plurality of solder bumps 25 is used to directly attach die 20 to substrate 12. It should be noted that when flip chip/direct chip attach is used, an underfilling 26 of the solder bumps 25 is needed before the molding operation. The underfilling 26 is typically a polymer adhesive material having low viscosity. Underfilling 26 completely fills the volume underneath die 20. Underfilling 26 also acts as a stress relieving medium for the die. Because underfilling 26 is a stress relieving medium, the material used for the underfilling should have an appropriate amount of filler material to control the coefficient of thermal expansion of underfilling 26 so as to minimize the thermal mismatch between silicon die 20 and substrate 12. Once die 20 is flip chip bonded to substrate 12, the overmolding operation can be performed as discussed above.

After the overmolding operation, the semiconductor die 20 can be functionally tested through the conductive traces 14. Testing the die 20 can be accomplished using existing test methods and apparatus, for instance by using conventional test probes, pogo-pins, or sockets.

Upon completion of die testing, an additional semiconductor die 27, or other electronic components, is mounted onto the second surface of substrate 12, as illustrated in FIG. 3. Although FIG. 3 illustrates that semiconductor die 27 is mounted directly opposite semiconductor die 20, such placement is not necessary in practicing the present invention. Die 27 can be positioned in any location on the second surface of substrate 12, provided appropriate interconnections to the second pattern of conductive traces 16 can be made. As indicated in FIG. 3, semiconductor die 27 is electrically connected to conductive traces 13 using wire bonds 22.

After semiconductor die 27 is attached to the second surface of substrate 12 and appropriate interconnections are made to conductive traces 16, a second molding step is performed to form a second package body 28, wherein a portion of conductive traces 16 is exposed to allow electrical access to the semiconductor die 27. Package body 28 is also an overmolded resin package body similar to package body 24. One difference between the two package bodies is that package body 28 is smaller than package body 24. In accordance with the present invention, the lower package body 28 should be smaller than the upper package body 24 so that electrical connections can be made to the second pattern of conductive traces on the bottom surface area of the substrate. As molded, package body 28 exposes a portion of conductive traces 16 around a perimeter of package body 28.

As illustrated in FIG. 4, a plurality of solder balls 32 is attached and electrically coupled to part of the exposed portion of conductive traces 16. The solder balls can also provide a thermal path from the device to the next level substrate, such as a PC board. To improve the adhesion between solder balls 32 and traces 16 and the solder-wettability of the traces, intermediate conductive layers (not illustrated) can be added to the exposed portions of the conductive traces. Common materials used to promote adhesion and wettability include gold, copper, and the like. The plurality of solder balls 32 should be of sufficient size to extend beyond package body 28, as illustrated in FIG. 4. Having the solder balls extend beyond package body 28 allows the solder balls to be easily coupled to a substrate without interference from the package body.

It should be noted that package bodies 24 and 28 have tapered sidewalls 30. Although not a requirement of the present invention, tapered sidewalls for packages which are formed on the bottom side of a device in accordance with the present invention facilitate attachment of solder balls. Vertical sidewalls on package bodies which are adjacent to solder ball locations may impede manufacturing equipment used to position the solder balls in place. Tapered sidewalls provide more space to accommodate various manufacturing equipment. Tapered sidewalls also aid in releasing a package body from a mold tool.

Additionally illustrated in FIG. 4 is a plurality of edge leads 36 which are selectively externally attached and electrically coupled to either of or both the upper and lower conductive traces 14 & 16 around the periphery of the substrate 12. These leads are commercially available in strip form with standard lead pitches, such as 0.65 mm or 0.5 mm, and are soldered to the conductive traces 14 & 16 through a reflow process. After the plurality of leads 36 are attached, then they can be trimmed and formed to the desired lead configuration. In this illustration, the leads are formed in a gull-wing configuration, although other configurations, such as J-leaded, are also possible.

Having externally attached leads is advantageous for several reasons. Instead of customizing a leadframe for each specific semiconductor die which is costly and time consuming, only the substrate 12 with its accompanying patterns of conductive traces 14 & 16 needs to be customized for a given die. Substrate changes require only a simple mask change which has a much faster cycle time than a leadframe design change, a difference of several days versus several weeks. In addition, the same lead pitch for semiconductor devices, having body sizes of 5 mm×5 mm to 40 mm×40 mm with lead counts ranging from 32 to 520, can be used. Another advantage to attaching external leads after the molding step is that a dam bar, commonly used in a leadframe, is not necessary, thus eliminating a subsequent process step of dam bar removal. In a conventional semiconductor device having a metal leadframe, a dam bar is a physical barrier between the leads which is used to control the flashing and bleeding of molding compound during the molding operation. This dam bar must be mechanically removed from the device in a subsequent operation so as to not short the leads. Removing the dam bar between the leads becomes more difficult as lead pitch becomes finer. Thus, the assembly process is more easily controllable without the dam bar removal step.

FIG. 4 further illustrates a completed multiple chip semiconductor device 10 as the device would be oriented on a conventional substrate 38, such as PC board, which has a plurality of conductive traces 40 corresponding in location to solder balls 32 and edge leads 36. The plurality of solder balls 32 can be used for power and ground connections. Because of the short distance between the device and the power and ground planes, the inductance and resistance of the device is kept to a minimum. The plurality of edge leads 36 can be used for signal leads. Hence, the combination of solder balls and edge leads in a device allows for increased I/Os without increasing the size of the packaged device.

Testing of semiconductor die 20 in device 10 can be accomplished at various points in manufacturing. For example, the die may be functionally tested after the second molding process but before the solder balls are attached. Alternatively, testing can be done after the solder balls are attached. However, to obtain the highest yield for device 10, it is recommended that lower yielding die be assembled first, and that higher yielding die be assembled second. By doing so, the die which is most likely to fail is identified during the first functional testing operation which occurs after the first molding step and before attachment of additional components to the other side of the substrate. Early failure identification eliminates unnecessary manufacturing steps beyond the first molding process. In reference to the figures, the steps illustrated in FIGS. 3 & 4 are eliminated if die 20 is recorded as a failed part, and subsequent manufacturing costs are avoided. Alternatively, if die 27 is lower yielding than die 20, it is more likely that manufacturing will continue through to the second encapsulation step before a failure is identified.

Figure 5:
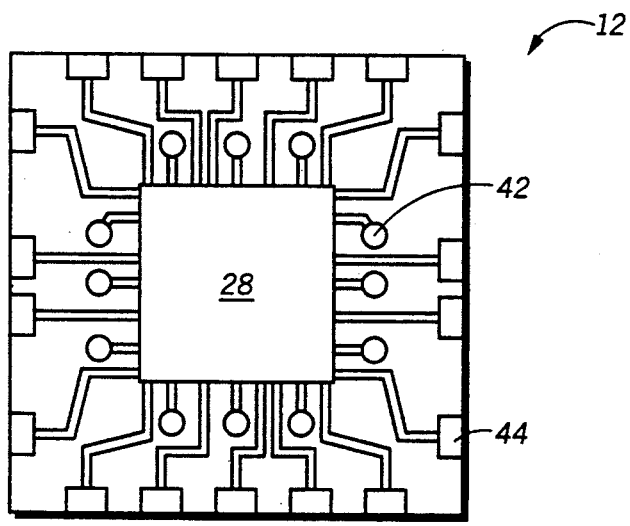
FIG. 5 illustrates, from a bottom view, the substrate of the semiconductor device illustrated in FIG. 4.

FIG. 5 is a bottom view of substrate 12. As illustrated in FIG. 5, and as mentioned above, package body 28 does not cover the entire surface area of the second surface of substrate 12, thus exposing a portion of the conductive traces 16. Conductive traces 16 have a plurality of solder pads 42 around the perimeter of package body 28. Solder balls 32 are electrically and physically coupled to solder pads 42. In addition to solder pads 42, the conductive traces 16 also have a plurality of edge connectors 44 around the periphery of substrate 12. Edge leads 36 are electrically and physically coupled to these edge connectors 44. The first (upper) side of substrate 12 also has a plurality of edge connectors as part of the pattern of conductive traces 14. An optional process step is to coat the edge leads after they are soldered onto the edge connectors with a polymer to add mechanical strength to the solder joints and to protect them from possible corrosion or leakage between the leads.

The remaining figures which illustrate further embodiments of the present invention incorporate many of the same or similar elements as those described above in reference to device 10. Therefore, like reference numerals designate identical or corresponding parts throughout the several views which follow.

Figure 6:
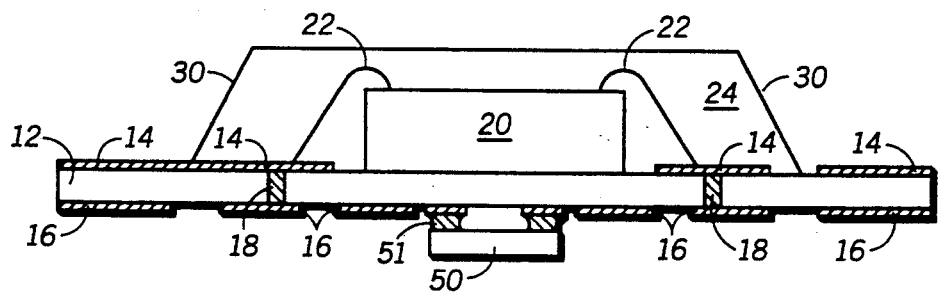
FIGS. 6–7 illustrate, in cross section, process steps in accordance with a second embodiment of the invention for the fabrication of a semiconductor device.
Figure 7:
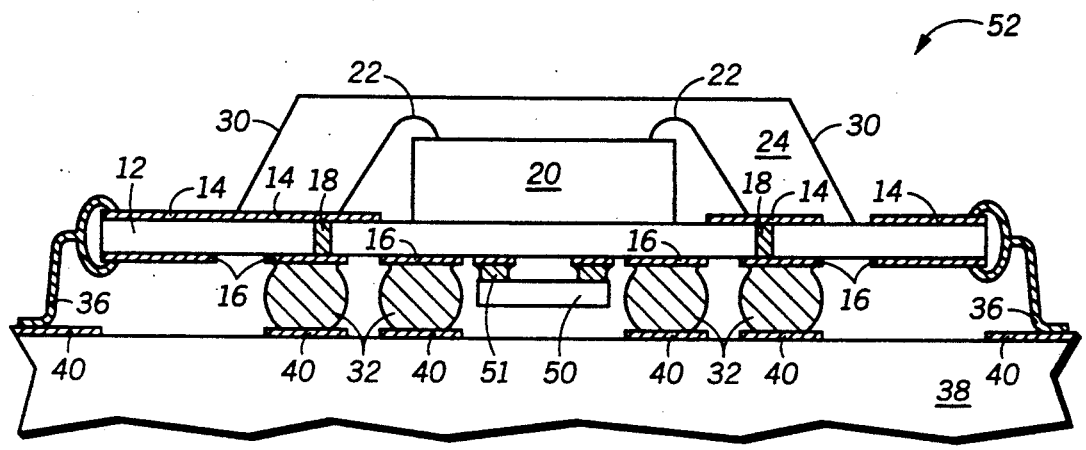

FIG. 6 illustrates an alternative process step leading to another embodiment of the present invention. In this embodiment, the method described in FIG. 1 is used to assemble a semiconductor die 20 onto a substrate 12. Once semiconductor die 20 is mounted, wire bonded, and overmolded on the first side of substrate 12, substrate 12 is turned over for the mounting of a second electronic component. As illustrated in FIG. 6, a passive electronic component 50, such as a resistor, diode, decoupling capacitor, or the like, is electrically coupled to conductive traces 16 by solder joints 51. Electronic component 50 does not need to be overmolded with an encapsulant. Once component 50 is attached to the second surface of substrate 12, solder balls 32 and edge leads 36 can be attached to the substrate as discussed above to form a semiconductor device 52 as illustrated in FIG. 7.

Figures 8, 9:
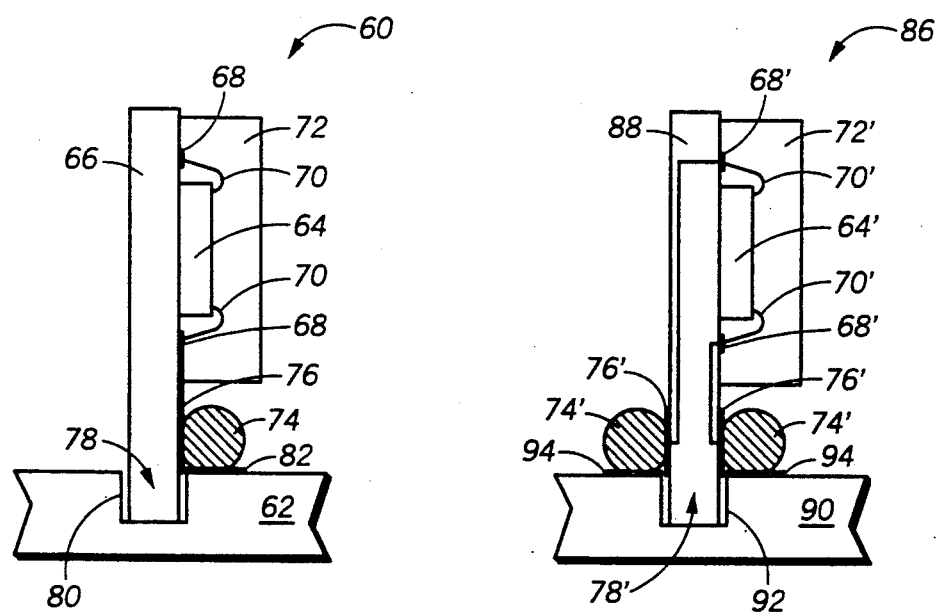
FIG. 8 illustrates, in cross section, a vertically mounted semiconductor device having solder balls on one side of the substrate, in accordance with a third embodiment of the invention.
FIG. 9 illustrates, in cross section, a vertically mounted multilayer substrate semiconductor device having solder balls on both sides of the substrate, in accordance with a fourth embodiment of the invention.

In an alternative embodiment of the invention, FIG. 8 illustrates a cross sectional view of a semiconductor device 60 vertically mounted on a PC board 62. Device 60 is processed and assembled through the first stages like a regular pad array carrier. A semiconductor die 64 is mounted and electrically connected to a substrate 66 having a pattern of conductive traces 68 by way of wire bonds 70. However, other methods of electrical connections such as tape automated bonding (TAB), flip chip/direct chip attach, or the like may also be used. After die 64 is electrically connected to conductive traces 68, an overmolding operation is performed to cover semiconductor die 64, wire bonds 70, and a first portion of the pattern of conductive traces 68 with an encapsulating material to form a package body 72. Package body 72 is formed in a conventional manner, such as by transfer molding. Alternatively, package body 72 can also be made by injection molding, pour molding, or in a "glob top" process. In each of these overmolding type operations, the encapsulating material is formed on one side of substrate 66. The encapsulating material thus surrounds the semiconductor die 64 the wire bonds 70 and at least a first portion of the pattern of conductive traces 68. However, unlike previous embodiments, only a portion of conductive traces along one edge of device 60 is exposed, thus providing a single-in-line contact configuration.

After the overmolding operation, the semiconductor die 64 can be functionally tested through the conductive traces 68. Once the die is verified to be functional, a plurality of solder balls 74 is attached to solder lands 76 which are a part of the conductive traces 68. Solder lands 76 have not been covered by the package body 72 and are located along the lower edge 78 of substrate 66. Lower edge 78 will be inserted into a PC board 62 that has a slot 80 for the purpose of vertically mounting the semiconductor device 60. PC board 62 has conductive traces 82 corresponding to the locations of the solder balls 74 where upon insertion, solder balls 74 are aligned with traces 82. The solder balls 74 are then reflowed to securely affix the semiconductor device 60 to the PC board 62.

FIG. 9 illustrates an additional embodiment where a semiconductor device 86 has essentially the same elements as device 60 of FIG. 8. However, the substrate 88 is multilayered so that conductive traces 68' can be routed to both surfaces of the substrate. In the embodiment illustrated in FIG. 9, a plurality of solder balls 74' is attached to both surfaces of the substrate 88 corresponding to the location of the solder lands 76'. The lower edge 78' of substrate 88 is inserted into PC board 90 where PC board 90 has a slot 92 with conductive traces 94 that are aligned with solder balls 74'. Reflowing the solder balls 74 forms symmetrical solder joints on both sides of the substrate 88 which provides a rigid support for the vertically mounted device.

FIG. 10 illustrates yet a further embodiment to the invention, where a multiple chip semiconductor device 98 is vertically mounted on a PC board 90'. In this embodiment, a semiconductor die 100 is mounted on each side of the substrate 102 thereby increasing the density of dice per device. Although the embodiment illustrates only one die per side of the substrate, the invention is not limited in practice to just one die per side but may accommodate a plurality of semiconductor dice per side. Thus, packing density is increased not only by the verical mounting of devices but also by multiple chip capability of each device. In FIG. 10, solder joints 104 are intended to illustrate the device 98 as already having been reflowed to the PC board 90'.

FIG. 11 illustrates a different embodiment of the invention wherein the semiconductor device 110 can have one of two configurations. Device 110 can have alignment pins 112 at both ends of the substrate 114 for insertion into a PC board 116; or device 110 can be manufactured without the alignment pins. In the case of no alignment pins, placement equipment is needed to hold the device in position prior to the device being soldered to a board. In the embodiment with alignment pins 112, the PC board 116 has two holes 118 at both ends of the substrate 114 instead of a slot as per FIGS. 8-10. The holes 118 are not connected to any conductive traces. A plurality of solder balls 74' are attached to the solder pads (not shown) of substrate 114. Once the pins 112 have been inserted into holes 118, the solder balls 74' make contact with the conductive traces 120 on PC board 116. The lower edge 120 of substrate 114 serves as a travel delimiter when pins 112 are inserted into holes 118. The solder balls 74' are then reflowed to the PC board 116, thus holding the semiconductor device 110 in place.

FIG. 12 is an oblique view of a semiconductor device 124 with edge half-vias 126 which are used to vertically mount the device to a PC board (not shown), illustrating a seventh embodiment of the invention. The half-vias 126 are plated and are located at the lower edge 128 of substrate 130 of device 124. Also illustrated in FIG. 12 is a plurality of solder balls 132 attached to the half-vias 126.

Figure 13:
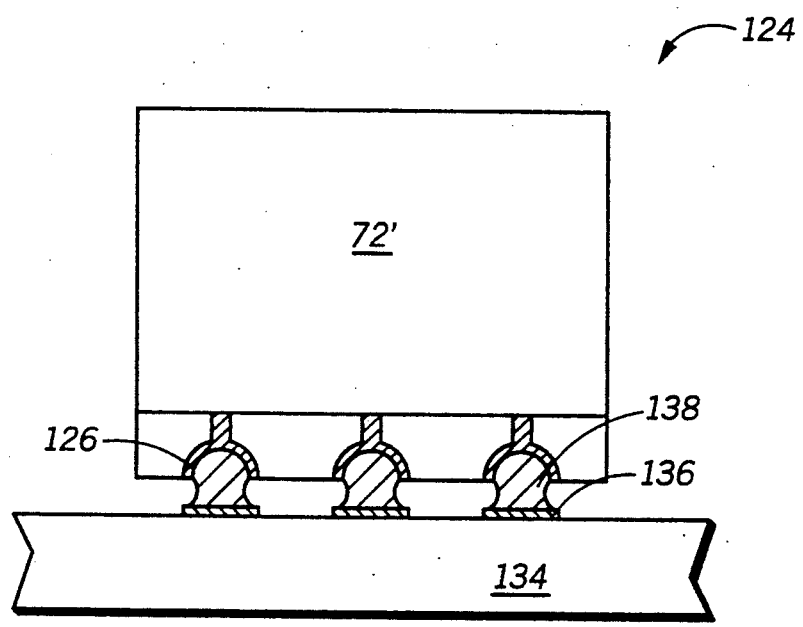
FIG. 13 illustrates, in a front view, the semiconductor device of FIG. 11 being vertically mounted on a PC board with reflowed solder ball joints.

Illustrated in FIG. 13 is device 124 positioned vertically on a PC board 134 having conductive traces 136. Solder balls 132, of FIG. 12, have been reflowed to form the physical and electrical solder connections 138 between device 124 and conductive traces 136. In this embodiment, the PC board 134 does not require slots or holes for mounting of the device onto the PC board.

The foregoing description and illustrations contained herein demonstrate many of the advantages associated with the present invention. In particular, it has been revealed that a manufacturing process which utilizes a PCB substrate approach can be used to manufacture low cost multiple chip semiconductor devices. Furthermore, the footprint of multiple chip semiconductor devices in accordance with the present invention can be very small by having semiconductor die or other components at two different levels within a device. The two levels are created as a result of two encapsulation operations, the first of which preferably encapsulates lower yielding die while the second is used to encapsulate higher yielding die. Unlike many conventional multiple chip devices, functional testing can occur prior to the second encapsulation operation. Therefore, failures can be detected early and manufacturing costs associated with unnecessary processing can be avoided.

Thus it is apparent that there has been provided, in accordance with the invention, a multiple chip semiconductor device and method for its fabrication which overcomes the problems associated with the prior art devices and methods. Although the invention has been described and illustrated with reference to specific embodiments thereof, it is not intended that the invention be limited to these illustrative embodiments. Those skilled in the art will recognize that variations and modifications can be made without departing from the spirit of the invention. For example, the pattern of conductive traces used on a substrate is not restricted by the present invention. The conductive trace pattern is dependent upon the types and configurations of the various semiconductor die and electronic components used in a device. Furthermore, it is possible to interchange multilayered substrates with substrates having plated through-holes and vice versa in any of the embodiments. In addition, the present invention is not limited to any specific number or kind of semiconductor die used. Also, other components may be used in place of, or in addition to, semiconductor dice. As an example, commonly used passive components, including resistors and capacitors, are likely to be advantageous in devices in accordance with the invention. Additionally, materials and methods other than those described for encapsulating the devices are possible. Also, solder ball configurations other than those specifically illustrated are anticipated as being suitable in practicing the invention. Moreover, it is possible to use a conductive epoxy in place of solder balls to attach devices to a PC board. Furthermore, some of the illustrated embodiments lend themselves to being inserted into a socket instead of being soldered to a board. Thus, it is intended to encompass within the invention all such variations and modifications as fall within the scope of the appended claims.

We claim:

1. A semiconductor device comprising:
   a substrate having a pattern of conductive traces on a surface of the substrate, the substrate also having a periphery;
   at least one electronic component mounted and electrically connected to the pattern of conductive traces;
   a package body overmolding the electronic component and a first portion of the pattern of conductive traces, leaving a second portion of the pattern of conductive traces exposed;
   a plurality of solder balls on a portion of the second portion of the pattern of conductive traces; and
   a plurality of edge leads externally connected to the periphery of the substrate wherein both the plurality of solder balls and the plurality of edge leads provide external electrical connections to the device.

2. A semiconductor device comprising:
   a substrate having a first pattern of conductive traces on a first surface of the substrate and a second pattern of conductive traces on a second surface of the substrate, the substrate also having a periphery;
   a first electronic component mounted and electrically connected to the first pattern of conductive traces on the first surface of the substrate;
   a second electronic component mounted and electrically connected to the second pattern of conductive traces on the second surface of the substrate;
   a first package body overmolding the first electronic component and a first portion of the first pattern of conductive traces on the first surface of the substrate, leaving a second portion of the first pattern of conductive traces exposed;
   a plurality of solder balls on the second surface of the substrate; and
   a plurality of edge leads externally connected to the periphery of the substrate wherein both the plurality of solder balls and the plurality of edge leads provide external electrical connections to the device.

3. The semiconductor device of claim 2 wherein at least one of the first and second electronic component is a semiconductor die.

4. The semiconductor device of claim 2 wherein at least one of the first and second electronic component is a passive electronic component selected from the group consisting of resistors, capacitors, and diodes.

5. The semiconductor device of claim 2 wherein the plurality of leads are soldered to the periphery of the substrate.

6. The semiconductor device of claim 2 wherein the plurality of solder balls are power and ground connections.

7. The semiconductor device of claim 2 wherein the plurality of leads are signal leads.

8. The semiconductor device of claim 2 wherein the second electronic component is substantially smaller than the first electronic component.

9. The semiconductor device of claim 2 further comprising:
   a second package body overmolding the second electronic component and a first portion of the second pattern of conductive traces on the second surface of the substrate, leaving a second portion of the second pattern of conductive traces exposed.

10. The semiconductor device of claim 9 wherein the first and second package bodies are formed from an epoxy resin molding compound.

11. The semiconductor device of claim 9 wherein the plurality of solder balls are located on the second portion of the second pattern of conductive traces on the second surface of the substrate.

12. The semiconductor device of claim 9 wherein the plurality of solder balls has a peripheral configuration around the second package body.

13. A semiconductor device comprising:
   a substrate having a first pattern of conductive traces on a first surface of the substrate and a second pattern of conductive traces on a second surface of the substrate, the substrate also having a periphery;
   a first semiconductor die mounted and electrically connected to the first pattern of conductive traces on the first surface of the substrate;
   a second semiconductor die mounted and electrically connected to the second pattern of conductive traces on the second surface of the substrate;
   a first package body overmolding the first semiconductor die and a first portion of the first pattern of conductive traces on the first surface of the substrate, leaving a second portion of the first pattern of conductive traces exposed;
   a second package body overmolding the second semiconductor die and a first portion of the second pattern of conductive traces on the second surface of the substrate, leaving a second portion of the second pattern of conductive traces exposed;
   a plurality of solder balls on the exposed second portion of the second pattern of conductive traces on the second surface of the substrate; and
   a plurality of edge leads externally connected to the periphery of the substrate wherein both the plurality of solder balls and the plurality of edge leads provide external electrical connections to the device.

14. The semiconductor device of claim 13 wherein the plurality of leads are soldered to the periphery of the substrate.

15. The semiconductor device of claim 13 wherein the plurality of solder balls are power and ground connections.

16. The semiconductor device of claim 13 wherein the plurality of leads are signal leads.

17. The semiconductor device of claim 13 wherein the second semiconductor die is substantially smaller than the first semiconductor die.

18. The semiconductor device of claim 13 wherein the plurality of solder balls has a peripheral configuration around the second package body.

19. The semiconductor device of claim 13 wherein the first and second package bodies are formed from an epoxy resin molding compound.

20. A semiconductor device comprising:
 a substrate having a first pattern of conductive traces on a first surface of the substrate and a second pattern of conductive traces on a second surface of the substrate, the substrate also having a periphery;
 a semiconductor die mounted and electrically connected to the first pattern of conductive traces on the first surface of the substrate;
 a passive electronic component mounted and electrically connected to the second pattern of conductive traces on the second surface of the substrate;
 a first package body overmolding the first semiconductor die and a first portion of the first pattern of conductive traces on the first surface of the substrate, leaving a second portion of the first pattern of conductive traces exposed;
 a plurality of solder balls on the second surface of the substrate; and
 a plurality of edge leads externally connected to the periphery of the substrate wherein both the plurality of solder balls and the plurality of edge leads provide external electrical connections to the device.

21. The semiconductor device of claim 20 wherein the plurality of leads are soldered to the periphery of the substrate.

22. The semiconductor device of claim 20 wherein the plurality of solder balls are power and ground connections.

23. The semiconductor device of claim 20 wherein the plurality of leads are signal leads.

24. The semiconductor device of claim 20 wherein the passive electronic component is selected from the group consisting of resistors, capacitors, and diodes.

25. A semiconductor device comprising:
 a PCB substrate having a pattern of conductive traces including a plurality of solder lands along an edge of the PCB substrate, wherein the plurality of solder lands are used as edge connectors;
 a first semiconductor die directly mounted on a first side of the PCB substrate, wherein the first semiconductor die is electrically coupled to the pattern of conductive traces;
 a first package body protecting the first semiconductor die and a first portion of the pattern of conductive traces on the PCB substrate, leaving the plurality of solder lands along the edge of the PCB substrate exposed; and
 a plurality of solder balls attached to the plurality of solder lands on the PCB substrate.

26. The semiconductor device of claim 25 wherein the PCB substrate is multilayered.

27. The semiconductor device of claim 25 wherein the pattern of conductive traces is on both a first and second surface of the PCB substrate, the PCB substrate further having vias to interconnect the pattern of conductive traces.

28. The semiconductor device of claim 25 wherein the plurality of solder balls attached to the plurality of solder lands is located on both the first and second surface of the PCB substrate along the edge of the PCB substrate.

29. The semiconductor device of claim 25 wherein the PCB substrate has at least one alignment pin extending from an edge of the PCB substrate where the plurality of solder lands lies along the edge, the alignment pin being a method for inserting the semiconductor device into a PC board.

30. The semiconductor device of claim 25 wherein the first semiconductor die is electrically coupled to the pattern of conductive traces by way of a plurality of wire bonds.

31. The semiconductor device of claim 25 wherein the first semiconductor die is electrically coupled to the pattern of conductive traces through flip chip bonding.

32. The semiconductor device of claim 25 further comprising:
 a second semiconductor die directly mounted on a second opposing side of the PCB substrate, wherein the second semiconductor die is electrically coupled to the pattern of conductive traces; and
 a second package body protecting the second semiconductor die.

33. The semiconductor device of claim 32 wherein the second semiconductor die is electrically coupled to the pattern of conductive traces by way of a plurality of wire bonds.

34. The semiconductor device of claim 32 wherein the second semiconductor die is electrically coupled to the pattern of conductive traces through flip chip bonding.

35. A semiconductor device comprising:
 a PCB substrate having a pattern of conductive traces including a plurality of plated half-vias along an edge of the PCB substrate, wherein the plurality of half-vias are used as edge connectors;
 a semiconductor die directly mounted on a first side of the PCB substrate, wherein the semiconductor die is electrically coupled to the pattern of conductive traces;
 a first package body protecting the semiconductor die and a first portion of the pattern of conductive traces on the PCB substrate, leaving the plurality of half-vias along the edge of the PCB substrate exposed; and
 a plurality of solder balls attached to the plurality of half-vias on the PCB substrate.

* * * * *